(12) United States Patent
Fogel et al.

(10) Patent No.: US 9,660,116 B2
(45) Date of Patent: May 23, 2017

(54) NANOWIRES FORMED BY EMPLOYING SOLDER NANODOTS

(71) Applicant: INTERNATIONAL BUSINESS MACHINES CORPORATION, Armonk, NY (US)

(72) Inventors: Keith E. Fogel, Hopewell Junction, NY (US); Jeehwan Kim, Cambridge, MA (US); Jae-Woong Nah, New York, NY (US); Devendra K. Sadana, Pleasantville, NY (US); Kuen-Ting Shiu, White Plains, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 11 days.

(21) Appl. No.: 15/093,255

(22) Filed: Apr. 7, 2016

(65) Prior Publication Data

US 2016/0233361 A1    Aug. 11, 2016

Related U.S. Application Data

(63) Continuation of application No. 14/944,741, filed on Nov. 18, 2015, now Pat. No. 9,318,641, which is a continuation of application No. 12/879,209, filed on Sep. 10, 2010, now Pat. No. 9,231,133.

(51) Int. Cl.
*H01L 31/0352* (2006.01)
*H01L 31/0236* (2006.01)
*H01L 31/18* (2006.01)
*H01L 31/0224* (2006.01)

(52) U.S. Cl.
CPC ........... *H01L 31/035227* (2013.01); *H01L 31/02363* (2013.01); *H01L 31/02366* (2013.01); *H01L 31/022425* (2013.01); *H01L 31/0352* (2013.01); *H01L 31/1804* (2013.01); *Y02E 10/50* (2013.01)

(58) Field of Classification Search
CPC ..... H01L 31/035227; H01L 31/022425; H01L 31/02363
USPC .... 257/48, 673, 737, 750, 778; 438/42, 106, 438/612, 614, 745
See application file for complete search history.

(56) References Cited

U.S. PATENT DOCUMENTS

| | | |
|---|---|---|
| 5,159,171 A | 10/1992 | Cook et al. |
| 5,170,990 A | 12/1992 | Kamiya et al. |
| 5,185,178 A | 2/1993 | Koskenmaki et al. |
| 5,366,140 A | 11/1994 | Koskenmaki et al. |
| 5,486,427 A | 1/1996 | Koskenmaki et al. |
| 6,033,928 A | 3/2000 | Eriguchi et al. |

(Continued)

FOREIGN PATENT DOCUMENTS

WO    2011033464    3/2011

OTHER PUBLICATIONS

Hsu, C., et al. "Wafer-Scale Silicon Nanopillars and Nanocones by Langmuir-Blodgett Assembly and Etching" Applied Physics Letter. vol. 93, Issue 13. Oct. 2008. (3 Pages).
Hong, A., et al. (Formation of Metal Nanospheres and Microspheres) Final Office Action for U.S. Appl. No. 13/606,916 mailed on Jul. 17, 2013. (9 Pages).
Hong, A., et al. (Uniformly Distributed Self-Assembled Solder Dot Formation for High Efficiency Solar Cells) Non Final Office Action for U.S. Appl. No. 13/611,047 mailed on Jul. 29, 2013. (39 Pages).
Hong, A., et al. (Formation of Metal Nanospheres and Microspheres) Non Final Office Action for U.S. Appl. No. 13/220,816 mailed on Aug. 1, 2013. (11 Pages).

(Continued)

*Primary Examiner* — Errol Fernandes
(74) *Attorney, Agent, or Firm* — Tutunjian & Bitetto, P.C.; Louis J. Percello

(57) ABSTRACT

A photovoltaic device and method include depositing a metal film on a substrate layer. The metal film is annealed to form islands of the metal film on the substrate layer. The substrate layer is etched using the islands as an etch mask to form pillars in the substrate layer.

9 Claims, 5 Drawing Sheets

(56) References Cited

U.S. PATENT DOCUMENTS

| | | |
|---|---|---|
| 6,338,980 B1 | 1/2002 | Satoh |
| 6,350,386 B1 | 2/2002 | Lin |
| 6,417,089 B1 | 7/2002 | Kim et al. |
| 6,605,772 B2 | 8/2003 | Harman et al. |
| 6,806,141 B2 | 10/2004 | Kamins |
| 7,227,066 B1 | 6/2007 | Roscheisen et al. |
| 7,589,880 B2 | 9/2009 | Kempa et al. |
| 7,605,327 B2 | 10/2009 | Roscheisen et al. |
| 7,634,162 B2 | 12/2009 | Kempa et al. |
| 7,740,713 B2 | 6/2010 | Duchesne et al. |
| 2003/0005956 A1 | 1/2003 | Hirata et al. |
| 2004/0149330 A1 | 8/2004 | Sugiyama et al. |
| 2007/0047056 A1 | 3/2007 | Kempa et al. |
| 2007/0137697 A1 | 6/2007 | Kempa et al. |
| 2007/0176288 A1 | 8/2007 | Daubenspeck et al. |
| 2008/0260941 A1 | 10/2008 | Jin |
| 2009/0139571 A1 | 6/2009 | Chen et al. |
| 2009/0194160 A1 | 8/2009 | Chin et al. |
| 2009/0274873 A1 | 11/2009 | Shinotsuka |
| 2009/0296189 A1 | 12/2009 | Black et al. |
| 2010/0071760 A1 | 3/2010 | Kwok et al. |
| 2010/0175749 A1 | 7/2010 | Tsutsumi et al. |
| 2010/0240167 A1 | 9/2010 | Dasgupta et al. |
| 2010/0258163 A1 | 10/2010 | Zheng et al. |
| 2010/0260977 A1 | 10/2010 | Singh et al. |
| 2010/0288329 A1 | 11/2010 | Hong et al. |
| 2010/0319758 A1 | 12/2010 | Ikuno |
| 2011/0121431 A1 | 5/2011 | Cui et al. |
| 2011/0277827 A1 | 11/2011 | Yang et al. |
| 2011/0284061 A1 | 11/2011 | Vanecek et al. |
| 2012/0060905 A1 | 3/2012 | Fogel et al. |

OTHER PUBLICATIONS

Fogel, K., et al. (Efficient Nanoscale Solar Cell and Fabrication Method) Non Final Office Action for U.S. Appl. No. 12/852,991 mailed on Sep. 16, 2013. (25 Pages).

Fogel, K., et al. (Nanowires Formed by Employing Solder Nanodots) Final Office Action issue in U.S. Appl. No. 13/599,577 on Sep. 20, 2013. (15 Pages).

Boudouris, "Polythiophene-Containing Block Copolymers for Organic Photovoltaic Applications" Dissertation submitted to the faculty of the Graduate School of the University of Minnesota. Aug. 2009. (290 Pages).

Hong, A., et al. "Metal Nanodot Memory by Self-Assembled Block Copolymer Lift-Off" Nano Letters, Dec. 2009. pp. 224-229.

Knizilevicius, R. "Simulation of Si and SiO2 Etching in CF4 Plasma" Vacuum 82, 2008. pp. 1191-1193.

Krzyzewski, T., et al. "Ripening and Annealing Effects in InAs/GaAs (001) Quantum Dot Formation" Journal of Applied Physics, vol. 96, No. 1. Jul. 2004. (8 Pages).

Zhu, J., et al. "Optical Absorption Enhancement in Amorphous Silicon Nanowire and Nanocone Arrays" Nano Letters. vol. 9, No. 1. Dec. 2008. pp. 279-282.

Patent Cooperation Treaty. "Notification of Transmittal of the International Search Report and the Written Opinion of the International Searching Authority, or the Declaration" Issued for PCT/US2012/052759 on Nov. 13, 2012. (17 Pages).

NANOWIRES FORMED BY EMPLOYING SOLDER NANODOTS

RELATED APPLICATION INFORMATION

This application is related to commonly assigned U.S. patent application Ser. No. 12/852,991 filed on Aug. 9, 2010, now U.S. Pat. No. 8,878,055 issued on Nov. 4, 2014, incorporated herein by reference in its entirety.

BACKGROUND

Technical Field

The present invention relates to integrated circuit devices, and more particularly to a device and method for fabricating a three-dimensional substrate structure with nanolayers.

Description of the Related Art

With growing concern about low cost clean energy, solar power has again become a focal point for alternatives to fossil fuel energy production. Solar energy, while clean and sustainable, typically relies on expensive technologies for its implementation. These technologies include the incorporation of integrated circuits or integrated circuit technology into the fabrication of solar cells. The expense associated with current solar panels is a strong disincentive from moving in the direction of solar power.

Solar panels employ photovoltaic cells to generate current flow. When a photon hits silicon, the photon may be transmitted through the silicon, reflected off the surface, or absorbed by the silicon if the photon energy is higher than the silicon band gap value. This generates an electron-hole pair and sometimes heat, depending on the band structure.

Nanorods or nanowires may be formed from the top down or from the bottom up. In one method, vertical nanowires are formed from the bottom up using gold nanodots as seeds. The seeds are employed as deposition sites where a high temperature chemical vapor deposition (CVD) process is required to grow the vertical wires from the seeds. This process is difficult to control and undesirable densities and sizes may result. This process is also expensive. In a top down approach, $SiO_2$ or polymer nanospheres are employed as a mask on a substrate. A solution-based coating process is required which is cost-additive and tends to be non-uniform. The process is characterized by relatively low selectivity etching between the mask and the nanowire materials (substrate). This process is also relatively expensive. In both processes, the temperatures are relatively elevated. This has a detrimental effect on the vertical wires formed.

SUMMARY

A photovoltaic device and method include depositing a metal film on a substrate layer. The metal film is annealed to form islands of the metal film on the substrate layer. The substrate layer is etched using the islands as an etch mask to form pillars in the substrate layer.

A method in accordance with the present principles includes depositing a solder film on a substrate layer; annealing the solder film to form islands of the solder film on the substrate layer; and etching the substrate layer using the islands as an etch mask to form pillars in the substrate layer.

Another method in accordance with the present principles includes depositing a solder film on a substrate layer; depositing a layer of flux on the solder film; forming islands of the metal film on the substrate layer by an anneal; etching the substrate layer using the islands as an etch mask to form pillars in the substrate layer; and forming a continuous photovoltaic stack including an N-type layer, a P-type layer and an intrinsic layer therebetween which conforms to a surface of the pillars formed in the substrate layer such that the continuous photovoltaic stack extends over tops and sidewalls of the pillars.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
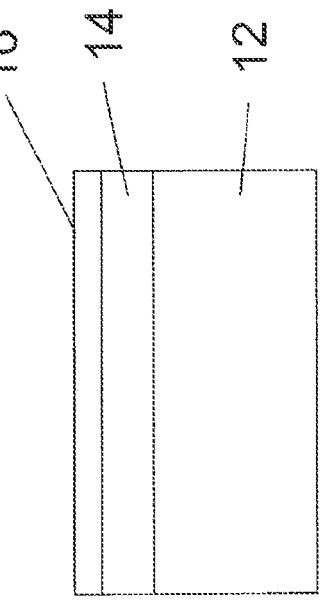
FIG. 1 is a cross-sectional view of a substrate layer having a metal film deposited thereon in accordance with one embodiment.

In accordance with the present principles, devices and methods for fabricating pillars or nanowires are provided. The devices employ a substrate layer having structures configured to provide a vertical component of a radiation absorption layer. The vertical component may include a nanowire structure having sides that carry the light absorbing material. The sides provide a depth to increase the likelihood of absorption of the radiation.

In one embodiment, the nanowires are formed by providing a solder material on a glass substrate. A flux is optionally deposited and annealed to generate nanodots on the solder. Flux reduces the oxidation rate allowing nanodots to form at extremely low temperatures of ~100 degrees C. An etching process is employed to form the nanowires in the substrate layer. The processing temperatures are preferably less than 200 degrees C. In this way, the structures provided are inexpensive and avoid expensive lithographic patterning or seeding of nanowires. The size and density of the nanowires formed in accordance with the present principles are well controlled and result in higher absorption efficiency.

The present principles provide significant differences between conventional nanowire formation processes which employ, e.g., nanowire formation using gold seeded bottom-up growth or a gold dot mask with etching. The present principles include: 1) a low temperature process (less than 300 degrees C., and more particularly less than 200 degrees C.). This is significantly lower that the conventional processes which include processing temperatures greater than 500 degrees C. The lower temperature removes the limit of nanowire formation capability and permits the use of polymer or glass nanowires and nanowire substrates. 2) The density of nanowire is much greater. The solder process competes between dot formation (ball-up) and oxidation of solder (e.g., Tin can be easily oxidized). Therefore, when the film is broken up for balling up, oxidation happens so that the patterns are frozen. The gold dot process does not offer this, resulting in low density of the dots. 3) Micrometer and nanometer sized dots are formed in the present embodiments. Gold dots do not permit the formation of micrometer scale dots since the melting point is too high. When compared to coating of a polymer nanosphere or oxide nanosphere, the nanosphere formation process is far more expensive and coverage is irregular. In addition, etch selectivity to a glass substrate is too low.

In accordance with particularly useful embodiments, a three-dimensional (3D) nanostructure includes conformal thin film solar cell depositions. These nanostructured solar cells will provide high efficiency with reduced cost. A hole-electron pair collection in, e.g., amorphous silicon (a low lifetime material) takes place within 300~500 nm from its surface. Light, however, can penetrate further than this depth. Therefore, a vertical array of thin amorphous silicon cells (with depth <300 nm) with more than 1 micron height will absorb more light and provide horizontal carrier collection within the distance of less than 300 nm.

Deposition of conformal low carrier life time materials (e.g., amorphous silicon) with thin thicknesses on the 3D-structured substrate provides cost effective structures with low potential damage of the surface and provides better performance. When 3D structures are employed in thin film photovoltaic devices, the thickness needed for planar photovoltaic devices is not necessary. Especially for amorphous Si photovoltaics, the thinner the layer, the less light degradation there is.

It is to be understood that the present invention will be described in terms of given illustrative architectures for a solar cell; however, other architectures, structures, substrate materials and process features and steps may be varied within the scope of the present invention. Since a solder ball can be sized from, e.g., 10 nm to a few microns, small solder balls can be a mask for a semiconductor quantum transistor device while micron scale is useful for photovoltaics. A circuit formed using these structures as described herein may be part of a design for an integrated circuit chip. The chip design may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips and/or solar cells. The resulting integrated circuit chips or cells can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes photovoltaic devices, integrated circuit chips with solar cells, ranging from toys, calculators, solar collectors and other low-end applications to advanced products.

The flowchart and block diagrams in the Figures illustrate the architecture, functionality, and operation of possible implementations of systems, and methods according to various embodiments of the present invention. It should be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Referring now to the drawings in which like numerals represent the same or similar elements and initially to FIG. 1, a cross-sectional view is depicted of a substrate or substrate layer 12 having a film 14, such as a metal film, formed thereon. The substrate 12 may include a plurality of different materials, but is preferably formed from a soft substrate material, such as glass or a polymer. The substrate 12 is preferably not deformable at processing temperatures used to form nanowires, as will be described. In one embodiment, the substrate 12 includes glass that deforms at temperatures, e.g., above 200 degrees C. A metal film 14 is formed on the substrate 12. The film 14 preferably includes tin, lead, antimony or other low melting point metals, and alloys thereof. The film 14 may be deposited by any known methods including sputtering, physical deposition, chemical vapor deposition, evaporation, etc. The film 14 may include a thickness of between about 1 nm to about 100 nm, although other thicknesses may also be employed. The thickness of the film 14 is one way for controlling a size of the later formed nanowires.

Figure 2:
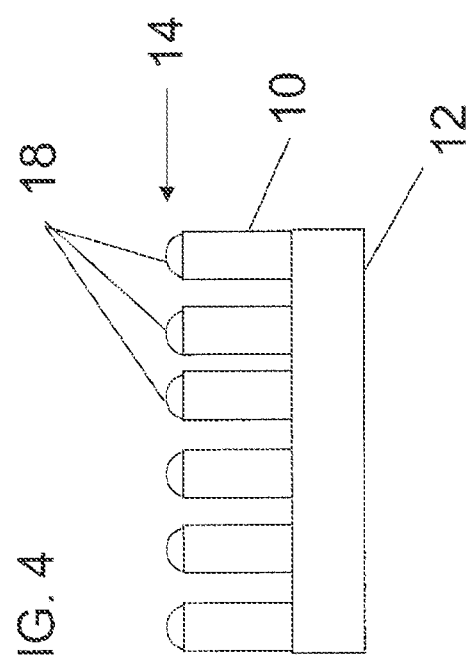
FIG. 2 is a cross-sectional view of a substrate layer having a flux layer formed on the metal film in accordance with one embodiment.

Referring to FIG. 2, a layer of flux 16 is formed over the film 14. The flux may include acid activators to break metal-oxides (e.g., methanesulfonic acid, monocarboxylic acids, sulfonic acids, formic acid, benzoic acid, nitrobenzoic acid, toluic acid, halogenated carboxylic acids, or dicarboxylic acids having the general formula $HOOC(CH_2)_nCOOH$, wherein n=1-7, etc.), tacking agents (e.g., glycerol) and/or wetting agents (e.g., 2-propanol) to adjust viscosity and surface tension. In a particularly useful embodiment, Diethylene-Triamine-Pentaacetic acid, Glyerol Ethoxylate, and/or IPA (2-propanol) may be employed. Any suitable flux, activator or agent 16 may be employed that is compatible with the materials selected for film 14 and provides the features as described herein. The flux 16 may be applied using any suitable method. In one embodiment, a flux vapor spray is applied to the film 14. The flux 16 protects a surface of the film 14 to prevent oxidation of the film 14 during subsequent processing, which includes annealing.

Figure 3:
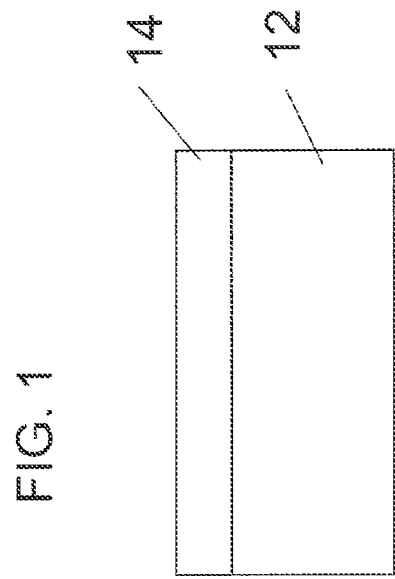
FIG. 3 is a cross-sectional view showing the substrate layer with islands of the metal film formed thereon by annealing in accordance with one embodiment.

Referring to FIG. 3, an anneal process is performed. The anneal process includes a time and temperature selected to cause the film (e.g., solder) 14 to flow and to form islands, balls or nanodots 18 due to surface tension. The time and temperature are selected to control the density of the balls 18. When the solder is broken up for balling up, oxidation occurs at the boundaries so that the patterns become frozen.

A larger ball density forms with higher temperature and longer duration. These parameters can be balanced to provide a desired density for given materials. In preferred embodiments, the temperature is maintained below 200 degrees C. In one particularly useful embodiment, the film 14 includes tin and the anneal temperature is less than 150 degrees C. for, say 10 seconds-10 minutes. Other times and temperatures may be employed.

The size of the solder balls may depend on the application of the device being formed. For example, if an integrated circuit chip is being fabricated, a highly dense mask can be used for the formation of quantum CMOS devices. Such dense solder balls may be used to pattern higher surface areas such as for three-dimensional batteries and the like.

The size of the balls 108 formed relies on the thickness of the film 14. Nanoscale thicknesses of film 14 result in nanoscale sized balls 18. In one example, which used a glass substrate 12 and an anneal temperature of 150 degrees C., a film of 5 nm in thickness formed nanodots (balls 18) of 20 nm without using flux (16). In another example, which used a glass substrate 12 and an anneal temperature of 150 degrees C., a film of 25 nm in thickness formed nanodots (balls 108) of 100 nm without using flux (106). In still another example, which also used a glass substrate 12 and an anneal temperature of 150 degrees C., a film of 5 nm in thickness formed nanodots (balls 108) of 1 micron using flux (106).

Figure 4:
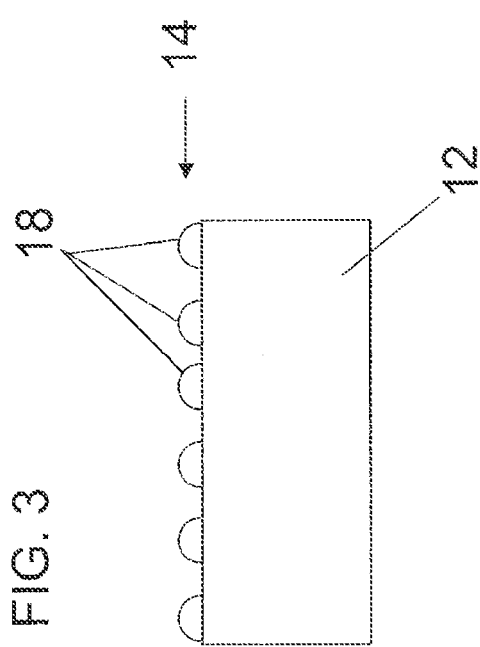
FIG. 4 is a cross-sectional view of the substrate layer etched using the islands as an etch mask in accordance with one embodiment.

Referring to FIG. 4, nanowires 10 are formed by employing an etch process which employs the balls 18 as a mask. Since the balls 18 collect material of the film 14 together, gaps form between the balls 18 to form islands. In these gaps, the underlying substrate 12 is exposed. The substrate 12 is etched to form nanowires 10. Film 14 is then removed during the etching process or may be removed by other means.

In one embodiment, the etching process may include a deep reactive-ion etching (DRIE). DRIE is a highly anisotropic etch process which may be employed to form deep, steep-sided holes and trenches in the substrate 104 with aspect ratios of e.g., 20:1 or more if etch selectivity is high. The DRIE process can fabricate 90° (vertical) walls, or tapered walls, e.g., 60°-89°. In one illustrative embodiment, DRIE is employed for duration of 10 minutes using $CF_4$ and $O_2$ to form nanowires 10 with a height of approximately 2 microns and a diameter of approximately 0.3 microns. Solder metal is nearly non-consumable in such gas (does not etch easily) so that an extremely high aspect ratio is ensured. The structure in FIG. 4 may be employed in a transistor device(s), battery, solar cell, or any other electronic device.

Figure 5:
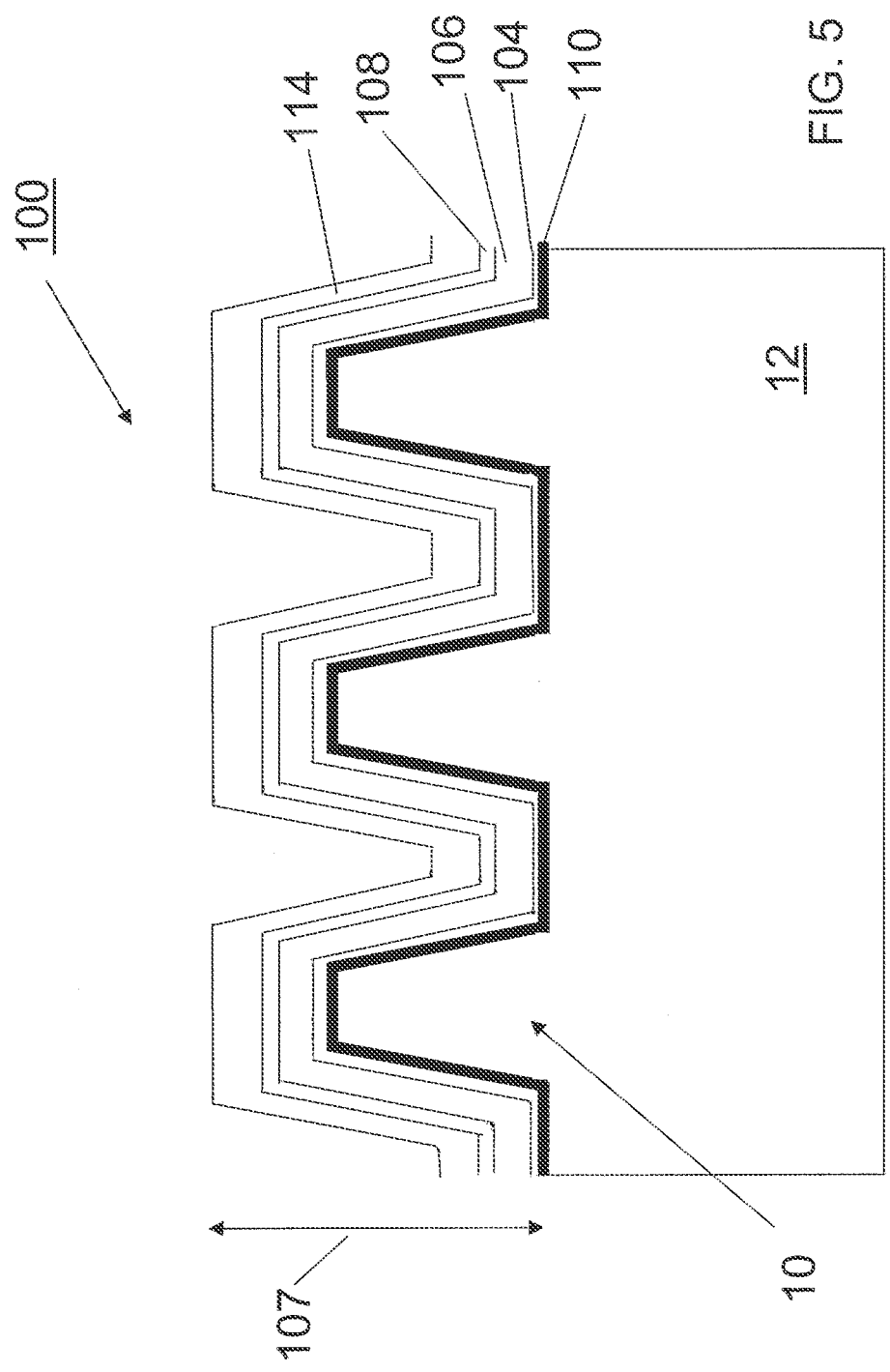
FIG. 5 is a cross-sectional view of a photovoltaic device having a plurality of pillars supporting a nanoscale junction on a transparent substrate in accordance with one embodiment.

Referring to FIG. 5, an illustrative photovoltaic structure 100 is illustratively depicted in accordance with one embodiment. The photovoltaic structure 100 may be employed in solar cells, light sensors or other photovoltaic applications. Structure 100 includes a substrate layer 12 that is prefabricated with nanowires 10 as formed in FIGS. 1-4. The substrate 12 may include a metal or other opaque material, such as aluminum, copper, etc. The substrate 12 may include a transparent material, such as glass, a polymer, transparent conductive oxide (TCO), etc. It should be noted that transparent materials for the substrate and nanowires permit light through the substrate, while opaque materials do not. The structures described herein may include transparent and/or opaque materials and receive light accordingly to activate light sensitive structures.

A transparent conductive material 110 may be included on substrate layer 12. The transparent conductive material 110 and adjacent layer 104 may together form an electrode of the structure 100. The transparent conductive material 110 may include a transparent conductive oxide (TCO), such as, e.g., a fluorine-doped tin oxide ($SnO_2$:F, or "FTO"), doped zinc oxide (e.g., ZnO:Al), and indium tin oxide (no) or other suitable materials.

A first layer 104 is formed on or over the substrate layer 12 (and/or transparent conductor 110, if present) and provides a first electrode. The first layer 104 may include amorphous silicon (e.g., a-Si:H), microcrystalline silicon ($③$c-Si:H), SiC or other suitable materials, such as, e.g., CIGS (CuInGaS), CdTe, poly Si or other kinds of materials for thin film solar cells. Layer 104 includes P-type characteristics in this embodiment. An intrinsic layer 106 is formed on layer 104. The intrinsic layer 106 includes a compatible material with layers 104 and 108. The intrinsic layer 106 is undoped. A layer 108 is formed on the intrinsic layer 106, and has an opposite polarity relative to the layer 104 (e.g., if layer 104 is P-type then layer 108 is N-type or vice versa). In this example, layer 108 is an N-type material and layer 104 is a P-type material. Layer 108 forms a second electrode of the structure. Different combinations of material may be employed to form the photovoltaic stack, for example, CdS(n-type)/CIGS(intrinsic (i-type))/Molybdenum (p-type) on glass 12. Other materials may be employed as well.

A back-reflector and electrode layer 114 may be formed on layer 108. The back-reflector layer 114 may include a transparent oxide, such as, ZnO and a reflective surface.

The 3D structure with nanowires 10 includes pillars of different shapes. The combined thickness of the layers 104, 106 and 108 may be between about 0.1~0.5 microns. A height 107 may be between about 1 micron and about 5 microns. For a single junction solar cell, pillar shapes are preferably angular for capturing light and increasing the chance of reabsorbing reflected light. For example, a preferred angle between a horizontal base and an edge of the pillar or line is between 90° and 92°.

Layers 104, 106 and 108 form a single junction configured to be light-absorbing of incident radiation. Note that layer 104 is in contact with or adjacent to the substrate layer 12 or layer 110 which may be configured to function as an optional back-reflector. The structure 100 is preferably a silicon thin-film cell, which includes silicon layers which may be deposited by a chemical vapor deposition (CVD) process, or a plasma-enhanced (PE-CVD)) from silane gas and hydrogen gas. Depending on the deposition parameters, amorphous silicon (a-Si or a-Si:H), and/or nanocrystalline silicon (nc-Si or nc-Si:H), also called microcrystalline silicon $③$c-Si:H may be formed.

In illustrative embodiments, structure 100 includes P-type amorphous or microcrystalline silicon (a or $③$c)-Si:H for layer 104 with a thickness of about 5 nm to about 20 nm. An N-type amorphous or microcrystalline silicon (a or (3c)-Si:H for layer 108 includes a thickness of about 5 nm to about 20 nm. In this case, the intrinsic layer 106 includes amorphous or microcrystalline silicon (a or (3c)-Si:H and may include a thickness of about 50 nm to about 300 nm. Other dimensions may be employed.

In accordance with the present principles, substrate layer 12 includes nanowires 10 that permit increased light absorption. In one embodiment, the nanowires 10 preferably include a height of between about 0.5 to about 5 microns and more preferably a height of between about 1-2 microns. For high lifetime materials, the nanowires 10 preferably include a height of about 1 to about 20 microns and more preferably a height of about 1 to about 10 microns. These dimensions are illustrative as shallower or deeper dimensions may be employed.

Figure 6:
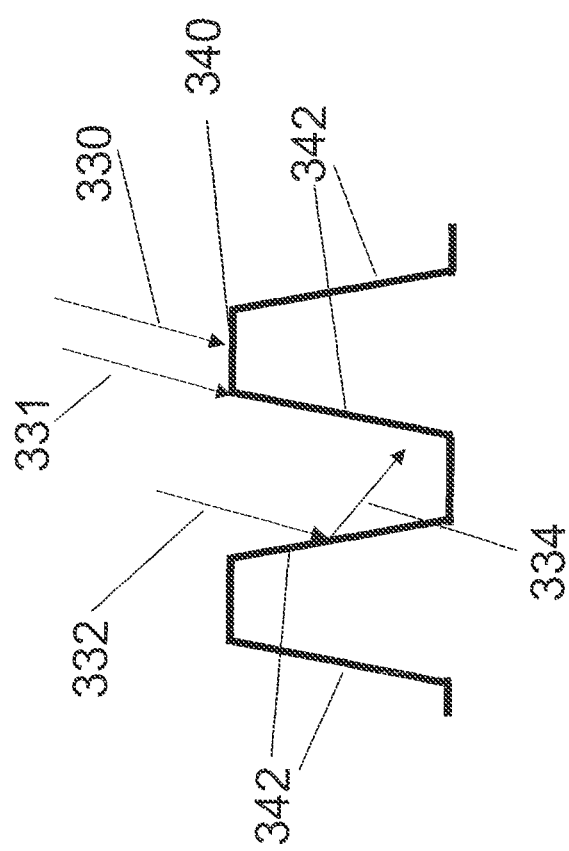
FIG. 6 is a diagram illustratively showing incident radiation falling of the structure of FIG. 5.

Referring to FIG. 6, several radiation rays 330, 331, 332 and 334 are illustratively depicted to show examples of how light absorption is increased using the structures of FIG. 5. Ray 330 falls incident on a plateau area 340. Radiation in this area 340 is absorbed as in a planar structure. However, the areas 340 are greatly reduced. Ray 331 falls incident along a plane 342 of a light absorbing layer. As a result, the effective thickness of the light absorbing layer has a longer length. Ray 331 is therefore most likely completely absorbed. Ray 332 falls incident at an angle relative to plane 342. Part of ray 332 is reflected as a result of the geometry. A reflected ray 334 falls incident on an opposing surface of the structure, there is a multiple reflection of the ray, and the reflected ray is further absorbed. In areas outside of plateau area 340, a greater amount of radiation absorption occurs resulting in significant increases in solar cell efficiency. Although light is depicted from a top direction, light may enter through a transparent substrate and/or adjacent layers and is efficiently absorbed as described.

In accordance with the present principles, a strong enhancement is provided for current density and voltage. Light loss is reduced in accordance with the present principles resulting in better operating efficiencies. Current density at short circuit ($J_{sc}$) is advantageously increased as a result of a single increased junction that occupies a large area of a panel and reduced light loss. In one embodiment, current density is enhanced by a factor of two or more over a planar panel design. In addition, open circuit voltage is advantageously increased.

Figure 7:
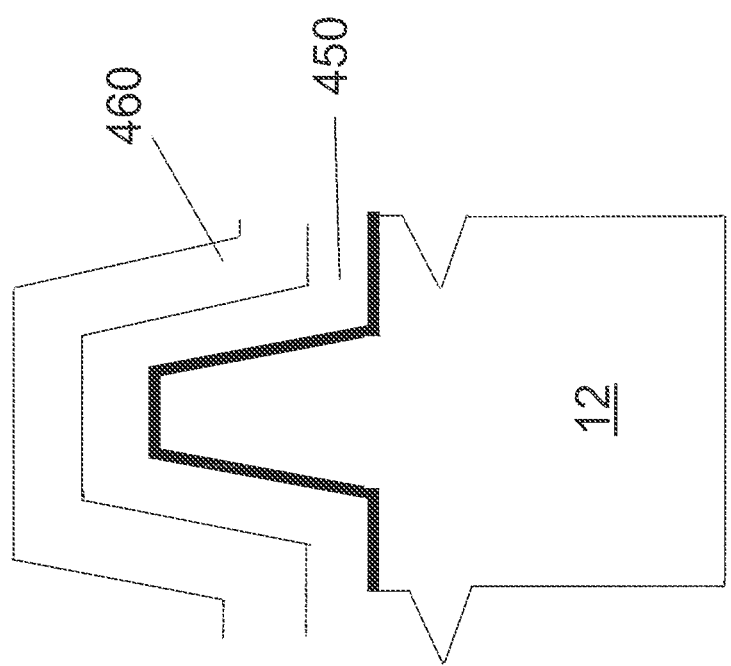
FIG. 7 is a is a cross-sectional view of the photovoltaic device of FIG. 2 having tandem nanoscale junctions by adding additional stacks in accordance with another embodiment.

Referring to FIG. 7, another embodiment shows tandem photovoltaic junction structures 450 and 460 in accordance with the present principles. An additional stack 460 (or junction) may be formed on the structure depicted in FIG. 5. Each structure 450, 460 includes a functional combination of light absorbing layers (e.g., layers 104, 106, 108). In a tandem configuration as shown, the structures preferably form about a 90 degree angle between the bottom of the grooves and the sidewalls of the structures since the sunlight or radiation can be equally absorbed by both layers 450 and 460.

Stack 460 forms a second junction stack on the junction stack 450. The stacks 450 and 460 may include, e.g., structure 100 depicted in FIG. 5. It should be understood that a greater number of junction stacks may be employed. The addition of stacks increases the open circuit voltage ($V_{oc}$) of the device and assists in maximizing its value.

Figure 8:
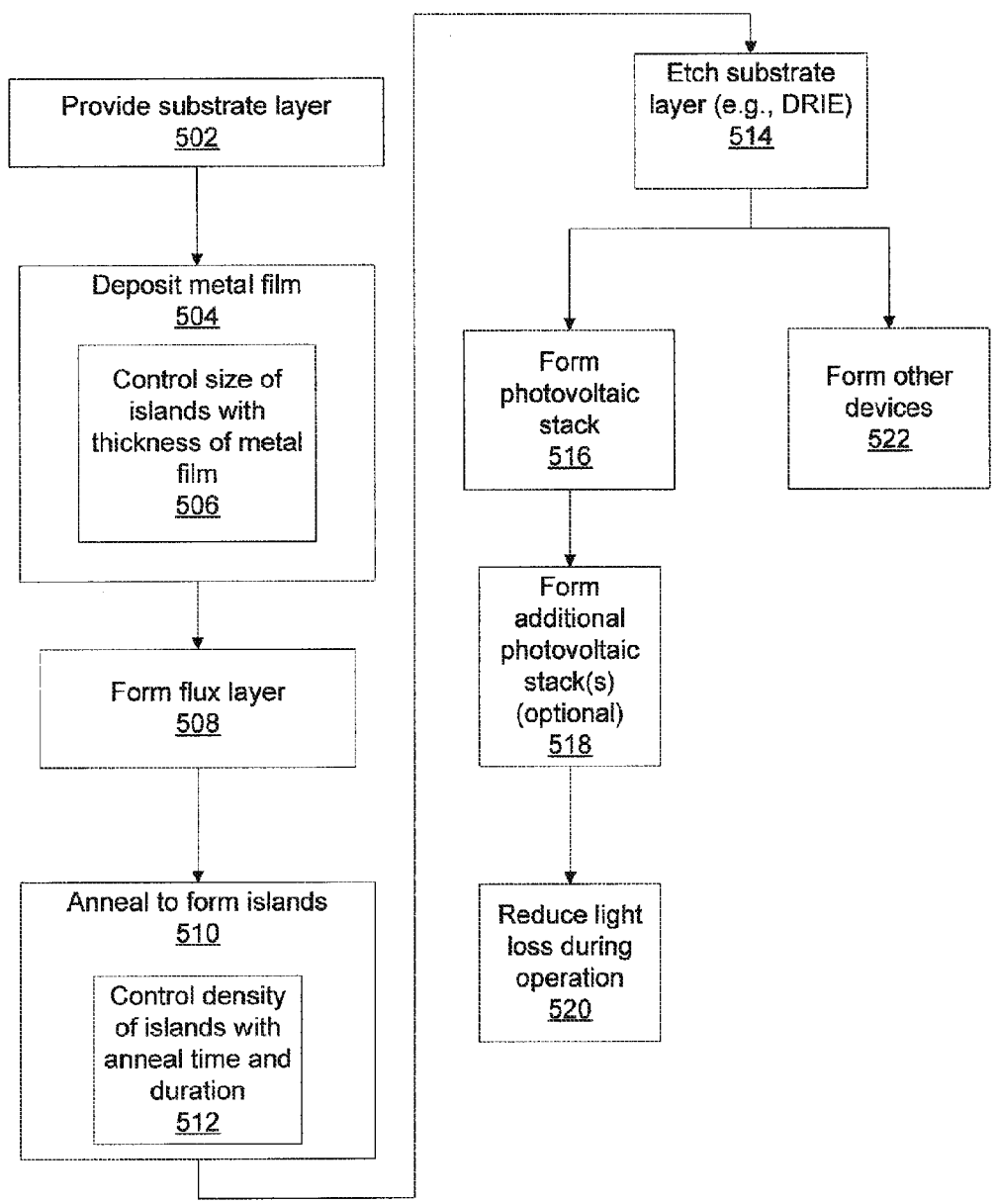
FIG. 8 is a flow diagram showing a method for fabricating a nanoscale pillars for a photovoltaic device or other semiconductor device in accordance with the present principles.

Referring to FIG. 8, a method for forming a device in accordance with one embodiment is illustratively shown. In block 502, a substrate layer is provided. In attempting to reduce cost, the present principles prefer the use of a non-semiconductor substrate layer material. For example, the substrate may include glass, a polymer, etc. In one embodiment, the substrate layer includes glass or a polymer and the method is performed at temperatures less than 200 degrees Celsius. It should be understood that other substrate materials may be employed. For example, the substrate may include silicon and the pillars formed in accordance with the present principles may be employed for forming vertical transistors or the like.

In block 504, a metal film is deposited on the substrate layer. The metal film may include tin, lead, or other low melting temperature metals. In block 506, a size of the islands is controlled in accordance with a thickness of the metal film. In block 508, a flux layer is formed on the metal film to protect the metal film.

In block 510, the metal film is annealed to form islands of the metal film on the substrate layer. In block 512, a density of the islands is controlled in accordance with a temperature and duration of the anneal. In block 514, the substrate layer is etched using the islands as an etch mask to form pillars in the substrate layer. The etching may include performing a deep reactive ion etch.

In block 516, in one embodiment, a continuous photovoltaic stack is formed including an N-type layer, a P-type layer and an intrinsic layer therebetween, which conforms to a surface of the pillars formed in the substrate layer such that the continuous photovoltaic stack extends over tops and sidewalls of the pillars in a three-dimensional structure. In block 518, at least one additional continuous photovoltaic stack may be formed on the continuous photovoltaic stack. In block 520, light loss is reduced by employing a geometry of the plurality of pillars to absorb light laterally reflected from sides of the pillars.

In other embodiments, in block 522, the method may be employed to form other devices using the nanowires. Such devices may include, e.g., a transistor device including a quantum transistor device, a three-dimensional battery, etc.

In accordance with the present principles, a cost-effective device and method for fabrication are provided. The methods provide for uniform formation of nanowires, the size and density of which is easy control. A high aspect ratio can be achieved due to high etch selectivity, and there are no material limitations as compared to prior art bottom up methods.

Having described preferred embodiments of nanowires formed by employing solder nanodots (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming an etch mask, comprising:
   forming a plurality of islands of microscale width by annealing a solder film that includes tin to form solder balls, wherein the islands of solder balls have a width greater than 1 micron; and
   controlling density of said plurality of islands by adjusting temperature of said annealing and duration of said annealing.

2. The method of claim 1, wherein the annealing being performed at temperatures less than 200 degrees Celsius.

3. The method as recited in claim 1, wherein said depositing includes controlling a size of the islands in accordance with a thickness of the solder film.

4. The method as recited in claim 1, further comprising forming a flux layer on the solder film to protect the solder film.

5. The method as recited in claim 1, wherein the solder film is deposited on a glass, polymer or semiconductor substrate layer.

6. A method of forming an etch mask comprising:
   depositing a layer of flux on a solder film comprising tin; and
   forming islands of solder balls having a microscale width greater than 1 micron from the solder film on the substrate layer by an anneal, wherein the anneal includes controlling a density of the islands in accordance with a temperature and duration of the anneal.

7. The method of claim 6, wherein the annealing being performed at temperatures less than 200 degrees Celsius.

8. The method as recited in claim 6, wherein said depositing includes controlling a size of the islands in accordance with a thickness of the solder film.

9. The method as recited in claim 6, wherein the solder film is deposited on a glass, polymer or semiconductor substrate layer.

* * * * *